United States Patent
Heo et al.

(10) Patent No.: US 8,129,997 B2
(45) Date of Patent: Mar. 6, 2012

(54) BATTERY CELL VOLTAGE MEASURING APPARATUS AND METHOD

(75) Inventors: Jin-Seok Heo, Daejeon (KR); Dal-Hoon Lee, Daejeon (KR); Jee-Ho Kim, Daejeon (KR); Sang-Hoon Lee, Daejeon (KR); Chang-Eon Jin, Daejeon (KR)

(73) Assignee: LG Chem, Ltd, Seoul (KR)

( * ) Notice: Subject to any disclaimer, the term of this patent is extended or adjusted under 35 U.S.C. 154(b) by 44 days.

(21) Appl. No.: 12/830,737

(22) Filed: Jul. 6, 2010

(65) Prior Publication Data

US 2010/0271035 A1 Oct. 28, 2010

Related U.S. Application Data

(63) Continuation of application No. PCT/KR2009/007049, filed on Nov. 27, 2009.

(30) Foreign Application Priority Data

Nov. 27, 2008 (KR) .................. 10-2008-0118661
Nov. 27, 2009 (KR) .................. 10-2009-0115768

(51) Int. Cl.
 *G01N 27/416* (2006.01)
(52) U.S. Cl. ............................................. 324/429
(58) Field of Classification Search ......... 324/426–436; 320/132
See application file for complete search history.

(56) References Cited

U.S. PATENT DOCUMENTS

| | | | |
|---|---|---|---|
| 2004/0051534 A1* | 3/2004 | Kobayashi et al. | 324/429 |
| 2006/0261677 A1* | 11/2006 | Shibuya et al. | 307/105 |
| 2007/0046260 A1* | 3/2007 | Ishikawa | 320/124 |
| 2007/0290674 A1 | 12/2007 | Bolz | |
| 2008/0164882 A1 | 7/2008 | Jaeger et al. | |
| 2008/0265901 A1 | 10/2008 | Shimizu | |

FOREIGN PATENT DOCUMENTS

JP 2007-507699 A 3/2007

* cited by examiner

*Primary Examiner* — Samuel Berhanu
(74) *Attorney, Agent, or Firm* — Birch, Stewart, Kolasch & Birch, LLP

(57) ABSTRACT

Disclosed is a battery cell voltage measuring apparatus and method. The battery cell voltage measuring apparatus comprises a plurality of floating capacitors provided corresponding to a plurality of cells contained in a battery pack; a plurality of switching units provided corresponding to each cell of the battery pack and switchable into a charge mode or a measurement mode; and a cell voltage detector for measuring the voltage of each cell by switching each switching unit into a charge mode to charge the voltage of each cell on each corresponding floating capacitor and time-differentially switching each switching unit into a measurement mode to apply the cell voltage charged on the floating capacitor between a reference potential and a common cell voltage measuring line.

22 Claims, 4 Drawing Sheets (a) CELL VOLTAGE CHARGING (b) CELL VOLTAGE HOLDING (c) CELL VOLTAGE MEASURING

BATTERY CELL VOLTAGE MEASURING APPARATUS AND METHOD

CROSS-REFERENCE TO RELATED APPLICATION

The present application is a continuation of National Phase Application No. PCT/KR2009/007049, filed on Nov. 27, 2009, which claims priority under 35 U.S.C. 119(a) to Korean Patent Application No. 10-2008-0118661 filed on Nov. 27, 2008 and Korean Patent Application No. 10-2009-0115768 filed on Nov. 27, 2009, all of which are hereby expressly incorporated by reference into the present application.

BACKGROUND OF THE INVENTION

1. Field of the Invention

The present invention relates to an apparatus and method for measuring the voltage of a plurality of cells contained in a battery pack.

2. Description of the Related Art

Generally, a high capacity battery pack used in electric vehicles, hybrid vehicles or the like, includes a plurality of cells capable of repeatedly charging and discharging. During charging/discharging of the battery pack, it is required to properly maintain the state of charge (SOC) of each cell and to protect the battery pack from abnormal circumstances such as over-charging or over-discharging. Thus, it needs to periodically measure and monitor the voltage of each cell using a cell voltage measuring apparatus.

FIG. 1 is a circuit diagram of a conventional battery cell voltage measuring apparatus 10.

Referring to FIG. 1, the conventional battery cell voltage measuring apparatus 10 comprises a floating capacitor (C), a first switch (SW1), a second switch (SW2), a cell voltage measuring circuit 20, an A/D converter 30 and a controller 40.

The first switch (SW1) is turned on by the controller 40 so as to make a cell voltage measurement. Accordingly, the voltage of each cell (B) is charged on each corresponding floating capacitor (C). After charging of the cell voltage, the first switch (SW1) is all turned off. When the first switch (SW1) is all turned off, the floating capacitor (C) is electrically isolated from the cell (B). Thereby the cell voltage is held on the floating capacitor (C).

After charging and holding of the cell voltage, the second switch (SW2) is subsequently turned on in order. Accordingly, the voltage (cell voltage) across each floating capacitor (C) is subsequently applied to the cell voltage measuring circuit 20.

The cell voltage measuring circuit 20 measures the voltage across each floating capacitor (C) subsequently applied thereto, and outputs an analog voltage signal corresponding to the voltage of each cell (B) to the A/D converter 30. Then, the A/D converter 30 converts the analog voltage signal into a digital voltage signal of a predetermined bit and outputs the digital voltage signal to the controller 40.

The controller 40 controls the overall operation of the first switch (SW1) and the second switch (SW2), and receives a digital voltage signal of each cell (B) outputted from the A/D converter 30 and stores the digital voltage signal in a memory (not shown). And, the controller 40 controls the charge/discharge of each cell (B) based on the digital voltage signal of each cell (B) stored in the memory, and performs various battery protection operations such as prevention of over-charging or over-discharging.

The cell voltage measuring circuit 20 includes a differential amplifier for outputting a voltage signal corresponding to the voltage across the floating capacitor (C) to the A/D converter 30. However, the conventional cell voltage measuring circuit 20 has cell voltage sensing lines L1 to L4 designed to measure the voltage of a plurality of cells using a single differential amplifier.

As shown in FIG. 1, the conventional cell voltage measuring apparatus 10 has cell voltage sensing lines L1 to L4 designed to measure the voltage of four cells using a single differential amplifier. Thus, when measuring the voltage of even-numbered cells, the polarity of the voltage across the floating capacitor (C) corresponding to even-numbered cells should be inverted. For this purpose, the cell voltage measuring circuit 20 has a polarity inversion circuit therein, which results in a complicated circuit structure of the cell voltage measuring apparatus 10.

SUMMARY OF THE INVENTION

The present invention is designed to solve the problems of the conventional field, and therefore it is an aspect of the present invention to provide an apparatus and method for measuring the voltage of a plurality of cells contained in a battery pack without using a differential amplifier and a polarity inversion circuit.

The present invention may provide a battery cell voltage measuring apparatus comprising a plurality of floating capacitors provided corresponding to a plurality of cells contained in a battery pack; a plurality of switching units provided corresponding to each cell of the battery pack and switchable into a charge mode or a measurement mode; and a cell voltage detector for measuring the voltage of each cell by switching each switching unit into a charge mode to charge the voltage of each cell on each corresponding floating capacitor and time-differentially switching each switching unit into a measurement mode to apply the cell voltage charged on the floating capacitor between a reference potential and a common cell voltage measuring line.

Preferably, the switching units are provided corresponding to each floating capacitor.

Preferably, each switching unit may comprise a first switch for connecting one terminal of each corresponding floating capacitor to one terminal of each corresponding cell or connecting the reference potential to the one terminal of the floating capacitor; and a second switch for connecting the other terminal of each corresponding floating capacitor to the other terminal of each corresponding cell or connecting the common cell voltage measuring line to the other terminal of the floating capacitor.

According to the present invention, the cell voltage detector may comprise a controller for controlling the operation of each switching unit.

According to an aspect of the present invention, the controller may switch each switching unit into a charge mode by controlling the first switch to connect one terminal of each corresponding floating capacitor to one terminal of each corresponding battery cell, and controlling the second switch to connect the other terminal of each corresponding floating capacitor to the other terminal of each corresponding battery cell.

Preferably, the controller may switch each switching unit into a charge mode simultaneously or time-differentially to charge the voltage of each corresponding cell on each corresponding floating capacitor.

According to another aspect of the present invention, the controller may switch each switching unit into a measurement mode by controlling the first switch to connect one terminal of each corresponding floating capacitor to the reference potential, and controlling the second switch to connect the other terminal of each corresponding floating capacitor to the common cell voltage measuring line.

According to yet another aspect of the present invention, before time-differentially switching each switching unit into a measurement mode, the controller may switch each switching unit into a hold mode to electrically isolate each corresponding floating capacitor from each corresponding battery cell.

That is, the controller may switch each switching unit into a hold mode by controlling the first switch to release a connection between one terminal of each corresponding floating capacitor and one terminal of each corresponding cell and controlling the second switch to release a connection between the other terminal of each corresponding floating capacitor and the other terminal of each corresponding cell.

Preferably, the controller may switch each switching unit into a hold mode simultaneously or time-differentially.

Preferably, the cell voltage detector may comprise a cell voltage amplifier for outputting the cell voltage applied between the reference potential and the common cell voltage measuring line. For example, the cell voltage amplifier may be a buffer.

Preferably, the cell voltage detector may further comprise an A/D converter for converting a cell voltage signal outputted from the cell voltage amplifier into a digital voltage signal.

In the present invention, the cell voltage detector may store the measured voltage of each cell in a memory.

The object of the present invention may further provide a battery pack, a battery management system or a battery operating apparatus comprising the above-mentioned battery cell voltage measuring apparatus.

The present invention may further provide a battery cell voltage measuring method for measuring the battery cell voltage using a plurality of floating capacitors provided corresponding to a plurality of cells contained in a battery pack; and a plurality of switching units provided corresponding to each cell of the battery pack and switchable into a charge mode or a measurement mode. The method comprises (a) switching the switching units into a charge mode to charge the voltage of each cell on each corresponding floating capacitor; and (b) time-differentially switching each switching unit into a measurement mode to apply the cell voltage charged on the floating capacitor between a reference potential and a common cell voltage measuring line and measuring the cell voltage.

Preferably, before the (b) step, the method may further comprise switching each switching unit into a hold mode to electrically isolate each corresponding floating capacitor from each corresponding cell.

Preferably, the voltage of each cell is simultaneously or time-differentially charged on each corresponding floating capacitor. And, each floating capacitor is electrically isolated from each corresponding cell simultaneously or time-differentially.

BRIEF DESCRIPTION OF THE DRAWINGS

The accompanying drawings illustrate the preferred embodiments of the present invention and are included to provide a further understanding of the spirit of the present invention together with the detailed description of the invention, and accordingly, the present invention should not be limitedly interpreted to the matters shown in the drawings.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
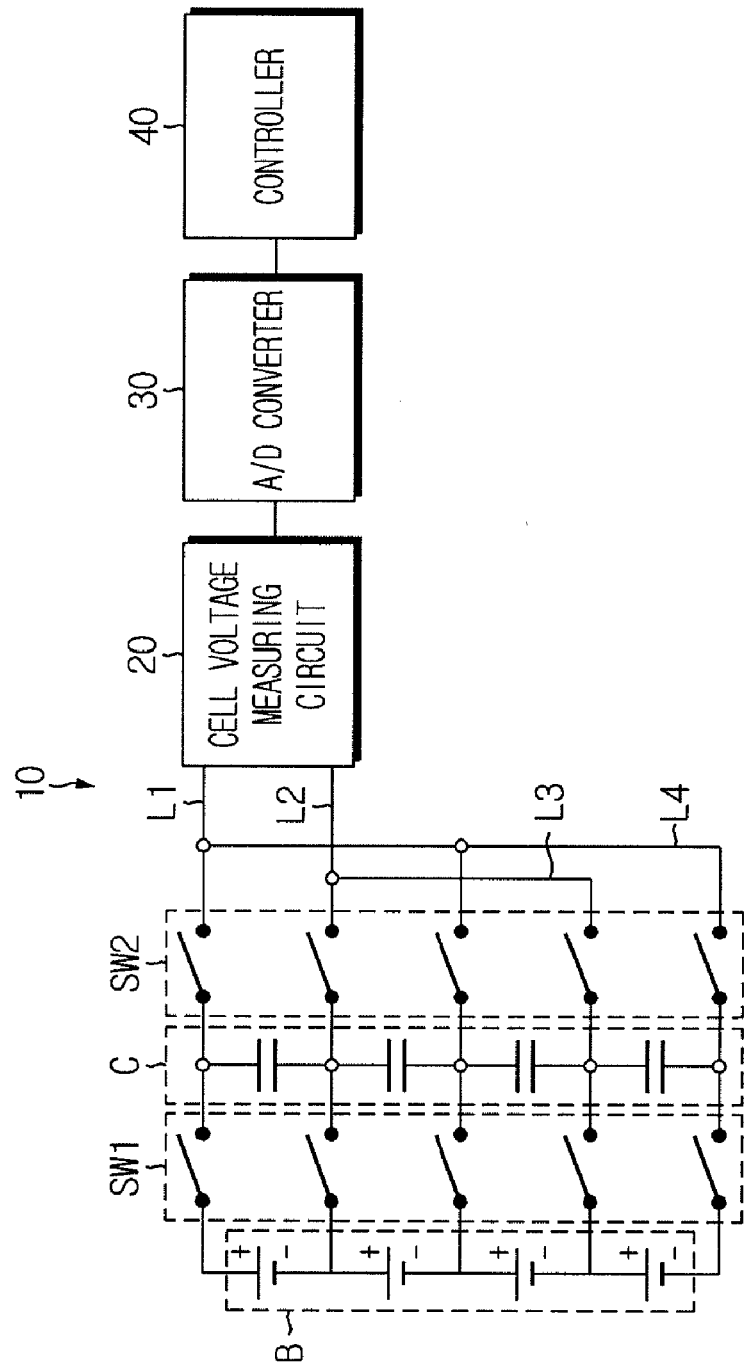
FIG. 1 is a circuit diagram of a conventional battery cell voltage measuring apparatus.
Figure 2:
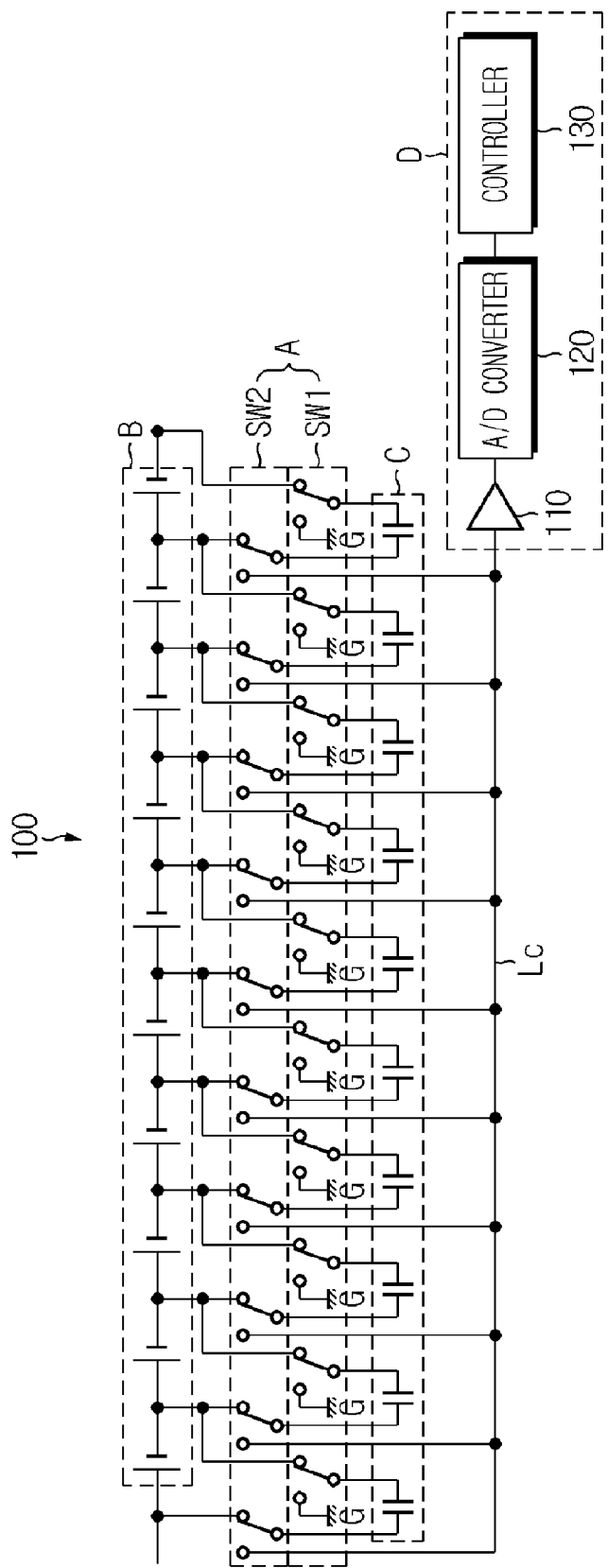
FIG. 2 is a circuit diagram of a battery cell voltage measuring apparatus according to an embodiment of the present invention.

FIG. 2 is a circuit diagram of a battery cell voltage measuring apparatus 100 according to a preferred embodiment of the present invention.

Referring to FIG. 2, the battery cell voltage measuring apparatus 100 according to the present invention comprises a plurality of floating capacitors (C) provided corresponding to a plurality of cells (B) contained in a battery pack, a plurality of switching units (A) provided corresponding to each floating capacitor (C), and a cell voltage detector (D).

Each switching unit (A) can be switched into a charge mode or a measurement mode. Additionally, the switching unit (A) can be switched into a hold mode.

Here, the charge mode represents a mode in which the voltage of each cell (B) is charged on each corresponding floating capacitor (C). The measurement mode represents a mode in which the cell voltage charged on each floating capacitor (C) is measured. And, the hold mode represents a mode in which each floating capacitor (C) is electrically isolated from each corresponding cell (B) prior to cell voltage measurement.

Each switching unit (A) comprises a first switch (SW1) and a second switch (SW2).

In a charge mode, the first switch (SW1) establishes a connection between one terminal of each floating capacitor (C) and one terminal of each corresponding cell (B), and in a hold mode, the first switch (SW1) releases the connection between one terminal of each floating capacitor (C) and one terminal of each corresponding cell (B). In a measurement mode, the first switch (SW1) establishes a connection between one terminal of each floating capacitor (C) and a reference potential (G).

Although the drawings show one terminal of each floating capacitor (C) as a low potential terminal and one terminal of each cell (B) as an anode terminal, the present invention is not limited in this regard.

In a charge mode, the second switch (SW2) establishes a connection between the other terminal of each floating capacitor (C) and the other terminal of each corresponding cell (B), and in a hold mode, the second switch (SW2) establishes a connection releases the connection between the other terminal of each floating capacitor (C) and the other terminal of each corresponding cell (B). In a measurement mode, the second switch (SW2) establishes a connection between the other terminal of each floating capacitor (C) and a common cell voltage measuring line (Lc).

Although the drawings show the other terminal of each floating capacitor (C) as a high potential terminal and the other terminal of each cell (B) as a cathode terminal, the present invention is not limited in this regard.

As mentioned above, the first switch (SW1) and the second switch (SW2) have a function for selective terminal connection to support a charge mode or a measurement mode together. Thus, the present invention can reduce the number of switch devices when compared with a case where a switch device without a function for selective terminal connection is used. That is, assuming the number of cells (B) is n, the present invention needs 2n number of switch devices. However, in case where a switch device without a function for selective terminal connection is used, it needs 4n number of switch devices.

The cell voltage detector (D) switches the switching unit (A) into a charge mode to charge the voltage of each cell (B) on each corresponding capacitor (C). At this time, the cell voltage detector (D) simultaneously or time-differentially switches each switching unit (A) into a charge mode to charge the voltage of each cell (B) on each corresponding capacitor (C).

And, the cell voltage detector (D) time-differentially switches each switching unit (A) into a measurement mode to apply the cell voltage charged on the floating capacitor (C) between the reference potential (G) and the common cell voltage measuring line (Lc), and measures the cell voltage.

Here, the term 'time-differentially' represents controlling a mode of each switching unit (A) at time intervals. For example, controlling a mode of each switching unit (A) from left to right or vice versa at time intervals denotes time-differentially controlling a mode of each switching unit (A). Hereinafter, the term 'time-differentially' is used with the same meaning as mentioned above.

Preferably, prior to time-differentially switching each switching unit (A) into a measurement mode, the cell voltage detector (D) switches each switching unit (A) into a hold mode to electrically isolate each corresponding floating capacitor (C) from each corresponding cell (B). At this time, the cell voltage detector (D) electrically isolates each floating capacitor (C) from each corresponding cell (B) simultaneously or time-differentially.

The cell voltage detector (D) comprises a cell voltage amplifier 110, an A/D converter 120 and a controller 130.

In a measurement mode, the cell voltage amplifier 110 amplifies the cell voltage charged on the floating capacitor (C) that was sequentially applied between the reference potential (G) and the common cell voltage measuring line (Lc) according to operation of the first switch (SW1) and the second switch (SW2), and outputs the cell voltage to the A/D converter 120.

Since the cell voltage amplifier 110 amplifies and outputs the cell voltage charged on the floating capacitor (C) based on the reference potential (G), the cell voltage amplifier 110 may be configured as a buffer of an operational amplifier, not a differential amplifier.

The A/D converter 120 converts an analog voltage signal outputted from the cell voltage amplifier 110 into a digital voltage signal, and outputs the digital voltage signal to the controller 130.

The controller 130 stores a digital voltage signal of each cell outputted from the A/D converter 120 in a memory (not shown), and controls charging/discharging of each cell or performs various battery protection such as prevention of over-charging or over-discharging, based on the stored digital voltage signal of each cell.

And, the controller 130 controls the operation of the first switch (SW1) and the second switch (SW2) comprised in each switching unit (A) to switch each switching unit (A) into a charge mode, a hold mode or a measurement mode.

Preferably, the controller 130 switches each switching unit (A) into a charge mode, a hold mode and a measurement mode in order, so as to measure the voltage of each cell. Here, switching into a charge mode or a hold mode is made simultaneously or time-differentially, and switching into a measurement mode is made time-differentially.

According to the charge mode, the controller 130 controls the first switch (SW1) to establish a connection between one terminal of each floating capacitor (C) and one terminal of each corresponding cell (B), and controls the second switch (SW2) to establish a connection between the other terminal of each floating capacitor (C) and the other terminal of each corresponding cell (B).

According to the hold mode, the controller 130 controls the first switch (SW1) and the second switch (SW2) to release an electrical connection between each floating capacitor (C) and each corresponding cell (B).

According to the measurement mode, the controller 130 controls the first switch (SW1) to establish a connection between one terminal of each floating capacitor (C) and the reference potential (G), and controls the second switch (SW2) to establish a connection between the other terminal of each floating capacitor (C) and the common cell voltage measuring line (Lc).

The controller 130 may be implemented as a microprocessor capable of executing a source code into which the battery cell voltage measuring method according to the present invention is programmed, or a semiconductor chip in which a control flow of the battery cell voltage measuring method according to the present invention is incorporated as a logic circuit. However, the present invention is not limited in this regard.

The battery cell voltage measuring apparatus according to the present invention may be combined with or comprised in a battery pack operating apparatus supplied with power from a battery pack.

For example, the present invention may be comprised in various kinds of electronic appliances supplied with the operating power from batteries, such as notebook computers, mobile phones, personal multimedia generators and so on.

As another example, the present invention may be comprised in various kinds of power systems having batteries embedded therein, such as fossil fuel vehicles, electric vehicles, hybrid vehicles, electric bikes, and so on.

In addition, the battery cell voltage measuring apparatus according to the present invention may be combined with or comprised in a battery management system (BMS) for controlling charging/discharging or protecting a battery pack from over-charging or over-discharging.

Furthermore, the battery cell voltage measuring apparatus according to the present invention may be comprised in a battery pack.

Figure 3:
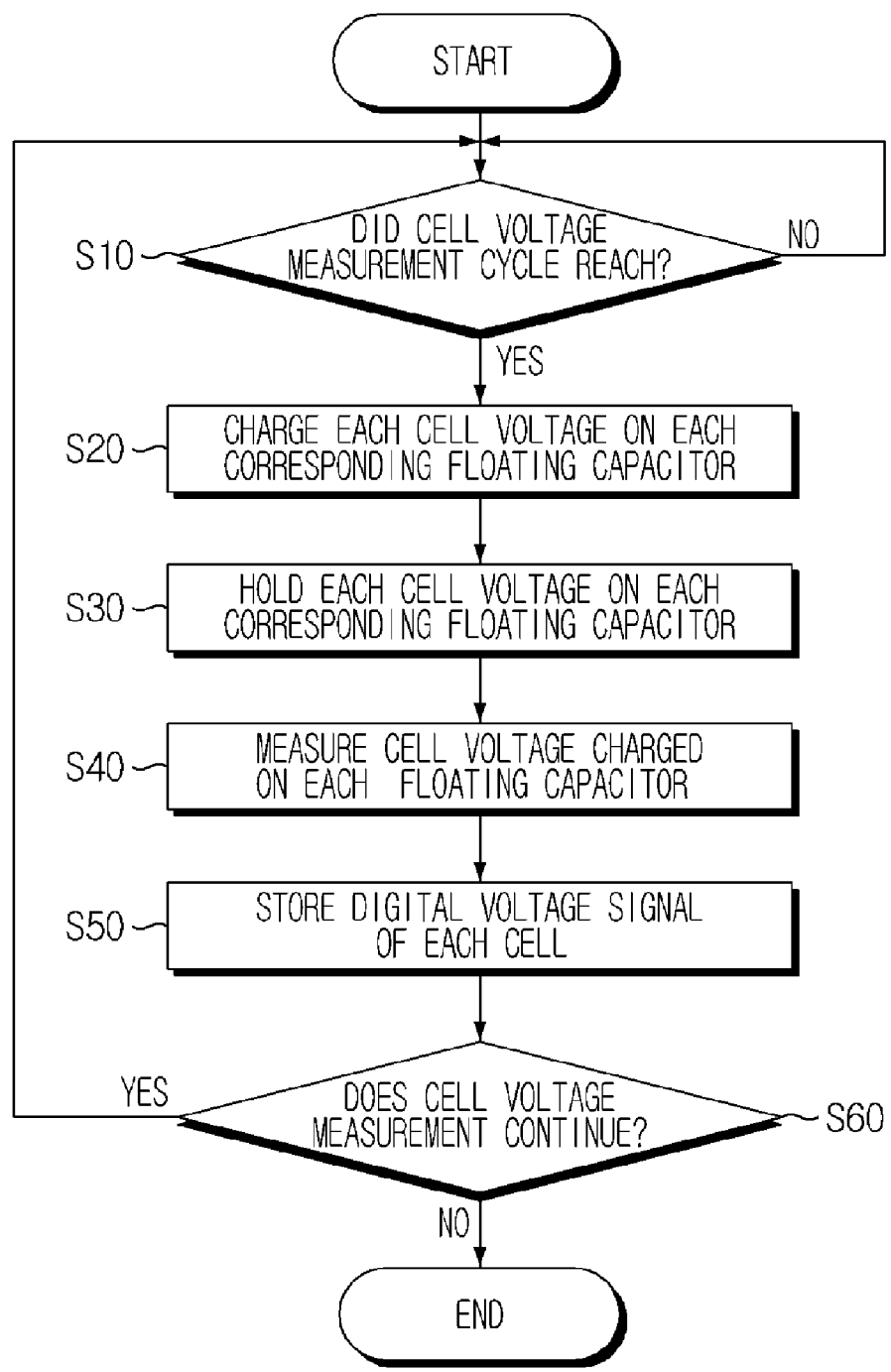
FIG. 3 is a flowchart of a battery cell voltage measuring method according to an embodiment of the present invention.
Figure 4:
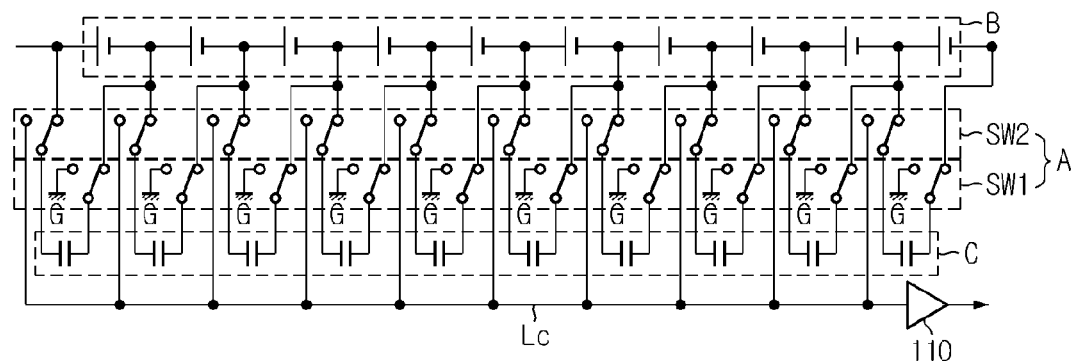
FIG. 4 is a view illustrating the contact point changes of a first switch and a second switch in a cell voltage charging step, a cell voltage holding step and a cell voltage measuring step.
Figure 4:
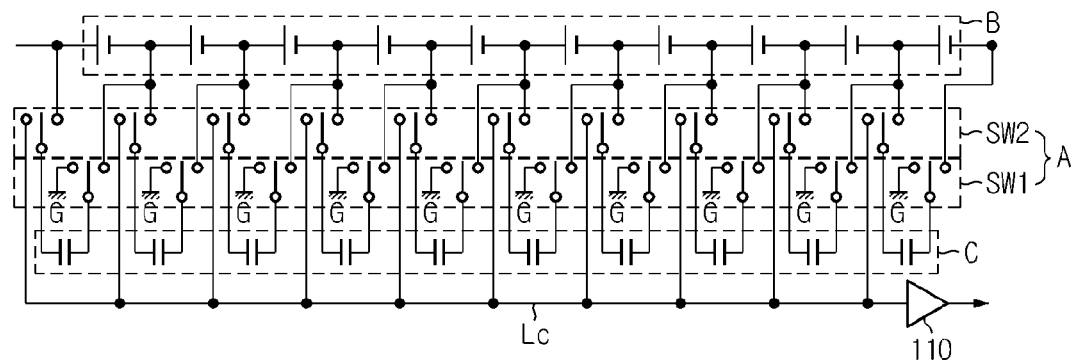
Figure 4:
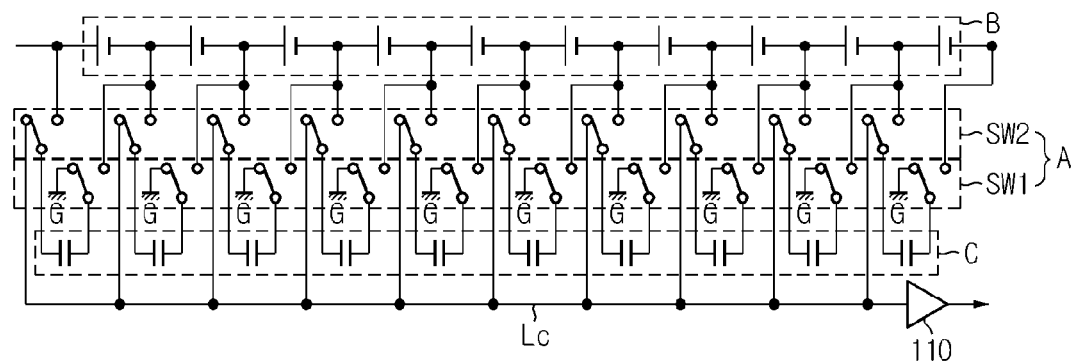

FIG. 3 is a flowchart of a battery cell voltage measuring method according to an embodiment of the present invention. FIG. 4 is a view illustrating the contact point changes of a first switch and a second switch in a cell voltage charging step, a cell voltage holding step and a cell voltage measuring step.

Hereinafter, a battery cell voltage measuring method according to an embodiment of the present invention is described in detail with reference to FIGS. 3 and 4.

First, in the step S10, the controller 130 determines whether a cell voltage measurement cycle reached or not. Here, the cell voltage measurement cycle may be arbitrarily set.

If the voltage measurement cycle reached, in the step S20, the controller 130 controls the first switch (SW1) and the second switch (SW2) to simultaneously or time-differentially connect each floating capacitor (C) to each corresponding cell (B) so that the voltage of each cell (B) is charged on each corresponding floating capacitor (C).

Referring to FIG. 4(a), in the step S20, the first switch (SW1) is turned on to establish a connection between one terminal of each floating capacitor (C) and one terminal of each corresponding cell (B) at contact points. In drawings, one terminal of the floating capacitor (C) is a low potential terminal and one terminal of the cell (B) is an anode terminal. And, the second switch (SW2) is turned on to establish a connection between the other terminal of each floating capacitor (C) and the other terminal of each corresponding cell (B) at contact points. In drawings, the other terminal of the floating capacitor (C) is a high potential terminal and the other terminal of the cell (B) is a cathode terminal.

Meanwhile, if it is determined in the step S10 that the voltage measurement cycle did not reach, the controller 130 does not initialize the battery cell voltage measuring process.

In the step S30, the controller 140 controls the first switch (SW1) and the second switch (SW2) to simultaneously or time-differentially isolate each floating capacitor (C) from each corresponding cell (B) so that an electrical connection between each floating capacitor (C) and each corresponding cell (B) is released. Then, the voltage of each cell (B) charged on each corresponding floating capacitor (C) is held.

Referring to FIG. 4(b), in the step S30, the contact points of the first switch (SW1) and the second switch (SW2) are floated. That is, the contact points of the first switch (SW1) and the second switch (SW2) are not connected to any terminal of the floating capacitor (C) and the cell (B).

In the step S40, the controller 140 time-differentially measures the voltage of each cell (B) by controlling the first switch (SW1) and the second switch (SW2) comprised in each switching unit (A) to time-differentially apply the voltage of each cell (B) charged on each corresponding floating capacitor (C) between the reference potential (G) and the common cell voltage measuring line (Lc).

Referring to FIG. 4(c), the first switch (SW1) is turned on to time-differentially establish a connection between one terminal of each floating capacitor (C) and the reference potential (G) at contact points. And, the second switch (SW2) is turned on to time-differentially establish a connection between the other terminal of each floating capacitor (C) and the common cell voltage measuring line (Lc) at contact points. In drawings, one terminal of the floating capacitor (C) is a low potential terminal and the other terminal is a high potential terminal. Thus, the voltage of each cell (B) charged on each corresponding floating capacitor (C) is sequentially applied between the reference potential (G) and the common cell voltage measuring line (Lc). Then, the cell voltage amplifier 110 time-differentially measures the voltage of each cell (B) applied between the reference potential (G) and the common cell voltage measuring line (Lc) and outputs each analog voltage signal to the A/D converter 120. Then, the A/D converter 120 receives each analog voltage signal of each cell (B) in order, converts each analog voltage signal into each digital voltage signal and outputs each digital voltage signal to the controller 130.

In the step S50, the controller 130 stores the digital voltage signal of each cell (B) sequentially outputted from the A/D converter 120 in a memory (not shown).

In the step S60, the controller 130 determines whether to continue the cell voltage measurement. If the battery is in use, it is possible to continue the cell voltage measurement. To continue the cell voltage measurement, the controller 130 directs the process to the step S10 and performs a cell voltage measurement of a next measurement cycle. On the contrary, to stop the cell voltage measurement, the controller 130 terminates the battery cell voltage measuring process.

Although not shown in the drawings, it is obvious to an ordinary person skilled in the art that the controller 130 may control charging/discharging of each cell or perform various battery protection operations such as prevention of over-charging or over-discharging, with reference to the digital voltage value of each cell stored in the memory.

Hereinabove, the present invention is described in detail with reference to the specific examples and the accompanying drawings. However, the description proposed herein is just a preferable example for the purpose of illustrations only, not intended to limit the scope of the invention, so it should be understood that other equivalents and modifications could be made thereto without departing from the spirit and scope of the invention.

INDUSTRIAL APPLICABILITY

According to an aspect of the present invention, it is possible to directly measure the voltage of a plurality of cells contained in a battery pack without using a differential amplifier and a polarity inversion circuit, resulting in a simple circuit configuration of a battery cell voltage measuring apparatus and a simple battery cell voltage measuring process.

And, according to another aspect of the present invention, each switching unit has a switch device with a function for selective terminal connection, and thus, this can reduce the number of switch devices when compared with a case where a switch device without a function for selective terminal connection is used.

What is claimed is:

1. A battery cell voltage measuring apparatus, comprising:
a plurality of floating capacitors provided corresponding to a plurality of cells contained in a battery pack;
a first switch for connecting one terminal of each corresponding floating capacitor to one terminal of each corresponding cell in a charge mode or connecting a reference potential to the one terminal of the floating capacitor in a measuring mode;
a second switch for connecting the other terminal of each corresponding floating capacitor to the other terminal of each corresponding cell in the charge mode or connecting a common cell voltage measuring line to the other terminal of the floating capacitor in the measuring mode; and
a cell voltage detector for measuring a voltage of each cell by switching each of the first and second switches into the charge mode to charge the voltage of each cell on each corresponding floating capacitor and time-differentially switching each of the first and second switches into the measurement mode to apply the cell voltage charged on the floating capacitor between the reference potential and the common cell voltage measuring line such that the cell voltage has the same polarity.

2. The battery cell voltage measuring apparatus according to claim 1, wherein the first and the second switches are provided corresponding to each floating capacitor.

3. The battery cell voltage measuring apparatus according to claim 1, wherein the cell voltage detector comprises a controller for controlling a mode of each of the first and second switches.

4. The battery cell voltage measuring apparatus according to claim 3, wherein the controller switches each of the first and second switches into the charge mode by controlling the first switch to establish a connection between one terminal of each corresponding floating capacitor and one terminal of each corresponding cell, and controlling the second switch to establish a connection between the other terminal of each corresponding floating capacitor and the other terminal of each corresponding cell.

5. The battery cell voltage measuring apparatus according to claim 3, wherein the controller switches each of the first and second switches into the measurement mode by controlling the first switch to establish a connection between one terminal of each corresponding floating capacitor and the reference potential and controlling the second switch to establish a connection between the other terminal of each corresponding floating capacitor and the common cell voltage measuring line.

6. The battery cell voltage measuring apparatus according to claim 4, wherein the controller simultaneously or time-differentially switches each of the first and second switches into the charge mode.

7. The battery cell voltage measuring apparatus according to claim 3, wherein the controller switches each of the first and second switches into a hold mode to electrically isolate each corresponding floating capacitor from each corresponding cell prior to time-differentially switching each of the first and second switches into the measurement mode.

8. The battery cell voltage measuring apparatus according to claim 7, wherein the controller switches each of the first and second switches into the hold mode by controlling the first switch to release a connection between one terminal of each corresponding floating capacitor and one terminal of each corresponding cell and controlling the second switch to release a connection between the other terminal of each corresponding floating capacitor and the other terminal of each corresponding cell.

9. The battery cell voltage measuring apparatus according to claim 1, wherein the cell voltage detector comprises a cell voltage amplifier for outputting the cell voltage applied between the reference potential and the common cell voltage measuring line.

10. The battery cell voltage measuring apparatus according to claim 9, wherein the cell voltage amplifier is a buffer.

11. The battery cell voltage measuring apparatus according to claim 7, wherein the controller simultaneously or time-differentially switches each of the first and second switches into the hold mode.

12. The battery cell voltage measuring apparatus according to claim 1, wherein the cell voltage detector switches each of the first and second switches into the charge mode, a hold mode and the measurement mode in order.

13. The battery cell voltage measuring apparatus according to claim 1, wherein the cell voltage detector further comprises an A/D converter for converting a cell voltage signal into a digital voltage signal.

14. The battery cell voltage measuring apparatus according to claim 1, wherein the cell voltage detector stores the measured voltage of each cell in a memory.

15. A battery operating apparatus, comprising the battery cell voltage measuring apparatus defined in claim 1.

16. A battery management system, comprising the battery cell voltage measuring apparatus defined in claim 1.

17. A battery pack, comprising the battery cell voltage measuring apparatus defined in claim 1.

18. A battery cell voltage measuring method which measures a battery cell voltage using a plurality of floating capacitors provided corresponding to a plurality of cells contained in a battery; pack and a first switch for connecting one terminal of each corresponding floating capacitor to one terminal of each corresponding cell in a charge mode or connecting a reference potential to the one terminal of the floating capacitor in a measuring mode; and a second switch for connecting the other terminal of each corresponding floating capacitor to the other terminal of each corresponding cell in the charge mode or connecting a common cell voltage measuring line to the other terminal of the floating capacitor in the measuring mode, the method comprising:
  (a) switching the first and second switches into the charge mode to charge a voltage of each cell on each corresponding floating capacitor; and
  (b) time-differentially switching each of the first and second switches into the measurement mode to apply the cell voltage charged on the floating capacitor between the reference potential and the common cell voltage measuring line such that the cell voltage has the same polarity, and measuring the cell voltage.

19. The battery cell voltage measuring method according to claim 18, further comprising:
  before the (b) step, switching each of the first and second switches into a hold mode to electrically isolate each corresponding floating capacitor from each corresponding cell.

20. The battery cell voltage measuring method according to claim 18, wherein, in the (a) step, the voltage of each cell is simultaneously or time-differentially charged on each corresponding floating capacitor.

21. The battery cell voltage measuring method according to claim 19, wherein each floating capacitor is electrically isolated from each corresponding cell simultaneously or time-differentially.

22. The battery cell voltage measuring method according to claim 18, further comprising:
  storing the measured voltage of each cell in a memory.

* * * * *